(12) United States Patent
Lee et al.

(10) Patent No.: US 8,529,714 B2
(45) Date of Patent: Sep. 10, 2013

(54) ROLL MOLD, METHOD FOR FABRICATING THE SAME AND METHOD FOR FABRICATING THIN FILM PATTERN USING THE SAME

(75) Inventors: Nam-Seok Lee, Seoul (KR); Seung-Hee Nam, Gyeonggi-do (KR); Shin-Bok Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 375 days.

(21) Appl. No.: 13/031,999

(22) Filed: Feb. 22, 2011

(65) Prior Publication Data

US 2011/0203723 A1 Aug. 25, 2011

(30) Foreign Application Priority Data

Feb. 23, 2010 (KR) .................. 10-2010-0016413
Apr. 2, 2010 (KR) .................. 10-2010-0030432

(51) Int. Cl.
*B32B 37/00* (2006.01)
(52) U.S. Cl.
USPC ............................................. 156/60
(58) Field of Classification Search
USPC .................... 156/217, 184, 196, 60
See application file for complete search history.

(56) References Cited

U.S. PATENT DOCUMENTS

| 5,266,257 A * | 11/1993 | Kildune .................. 264/224 |
| 2010/0064918 A1 | 3/2010 | Shigeta et al. |
| 2010/0089262 A1 | 4/2010 | Seong et al. |

FOREIGN PATENT DOCUMENTS

| CN | 101272918 A | 9/2008 |
| CN | 101612849 A | 12/2009 |
| CN | 101622121 A | 1/2010 |
| JP | 2-217234 A * | 8/1990 |
| JP | 03-198029 | 8/1991 |
| JP | 2000-015770 A | 1/2000 |
| JP | 2001-310340 A * | 11/2001 |

OTHER PUBLICATIONS

First Notification of Office Action dated May 2, 2013 from The State Intellectual Property Office of China in counterpart Chinese application No. 201110041054.9.

* cited by examiner

*Primary Examiner* — Jeff Aftergut
(74) *Attorney, Agent, or Firm* — Morgan, Lewis & Bockius LLP

(57) ABSTRACT

The present invention provides a roll mold, a method for fabricating the same and a method for fabricating a thin film pattern using the same, to prevent dimensional variation of the mold and simplify the overall process. The method for fabricating a roll mold includes providing a rigid substrate or flexible substrate provided with a master pattern, providing a base roller arranged on the substrate provided with the master pattern, forming a mold surface layer on the substrate provided with the master pattern, forming an adhesive resin layer on the mold surface layer or the base roller, rolling the base roller over the rigid substrate or flexible substrate to form the adhesive resin layer and the mold surface layer on the base roller, and curing the adhesive resin layer and mold surface layer formed on the base roller to adhere the adhesive resin layer and the mold surface layer to the base roller and fix the same thereon.

7 Claims, 14 Drawing Sheets

ROLL MOLD, METHOD FOR FABRICATING THE SAME AND METHOD FOR FABRICATING THIN FILM PATTERN USING THE SAME

This application claims the benefit of Korean Patent Application No. P2010-0016413, filed on Feb. 23, 2010 and Korean Patent Application No. P2010-0030432, filed on Apr. 2, 2010, which is hereby incorporated by reference as if fully set forth herein.

BACKGROUND OF THE INVENTION

1. Field of the Invention

The present invention relates to a roll mold, a method for fabricating the same and a method for fabricating a thin film pattern using the same.

2. Discussion of the Related Art

A variety of flat panel display devices to reduce weight and volume of the problems of cathode ray tubes have been introduced. Examples of flat panel display devices include liquid crystal display devices, field emission display devices, plasma display panel devices and electroluminescent (EL) display devices.

Such a flat panel display device includes a plurality of thin films formed by a mask process including a series of deposition (coating), exposure to light, developing and etching processes. However, the mask process is complicated, thus disadvantageously increasing fabrication costs. Accordingly, recently, research into formation of thin films by an imprinting process using a roll mold 10 illustrated in FIG. 1A is underway.

Such a roll mold 10 is formed by patterning the surface of a base roller 14 via an etching process. Specifically, an etch-protecting layer on the surface of the base roller 14 and a mask pattern are sequentially formed, the etch-protecting layer is patterned by a primary etching process using the mask pattern as a mask, the surface of the base roller 14 is patterned by a secondary etching process using the patterned etch-protecting layer as a mask to obtain a roll mold 10 provided with a groove 12.

The roll mold 10 requires two etching processes, thus complicating the overall manufacturing process. The diameter of the base roller 14 is decreased through two etching processes, thus disadvantageously causing variation in the final size of the roll mold 10 and deformation thereof.

In order to solve these problems, as shown in FIG. 1B, a method of adhering a flat panel mold 22, obtained by forming a pattern layer 20 on a flexible substrate 18, to a base roller 16 has been suggested. However, during adhesion of the base roller 16 to the flat panel mold 22, misalignment often occurs, disadvantageously causing dimensional error.

SUMMARY OF THE INVENTION

Accordingly, the present invention is directed to a roll mold, a method for fabricating the same and a method for fabricating a thin film pattern using the same that substantially obviate one or more problems due to limitations and disadvantages of the related art.

It is one object of the present invention to provide a roll mold, a method for fabricating the same and a method for fabricating a thin film pattern using the same, to prevent dimensional variation of the mold and simplify the overall manufacturing process.

To achieve the object and other advantages and in accordance with the purpose of the invention, as embodied and broadly described herein, provided is a method for fabricating a roll mold including: providing a rigid substrate or flexible substrate provided with a master pattern; providing a base roller arranged on the substrate provided with the master pattern; forming a mold surface layer on the substrate provided with the master pattern; forming an adhesive resin layer on the mold surface layer or the base roller; rotating the base roller on the rigid substrate or flexible substrate to form the adhesive resin layer and the mold surface layer on the base roller; and curing the adhesive resin layer and mold surface layer formed on the base roller to adhere the adhesive resin layer and the mold surface layer to the base roller and fix the same thereon.

The step of providing the rigid substrate or flexible substrate provided with the master pattern may include forming a master pattern layer including a protrusion pattern and a groove pattern to provide the master pattern on the rigid substrate or flexible substrate having a flat surface, wherein the master pattern layer is made of an organic material which can be stripped, wherein the mold surface layer is made of diamond like carbon (DLC), silicon oxide ($SiO_2$) or indium tin oxide (ITO), wherein the adhesive resin layer is a thermocurable or photocurable adhesive.

The method may further include: forming an anti-adhesion layer between the mold surface layer and the master pattern layer.

The method may further include: removing the master pattern layer remaining on the mold surface layer through a stripping process, after adhering the adhesive resin layer and the mold surface layer to the base roller and fixing the same thereon.

The step of rolling the base roller on the rigid substrate or flexible substrate may be carried out by rolling the base roller on the flexible substrate, while adhering one end of the flexible substrate to a un-winder and adhering another end of the flexible substrate to a re-winder, and keeping the flexible substrate level.

In accordance with another aspect of the present invention, provided is a method for fabricating a roll mold including: providing a rigid substrate or flexible substrate provided with a master pattern; providing a base roller arranged on the substrate provided with the master pattern; forming an adhesive resin layer on the substrate provided with the master pattern; rotating the base roller on the rigid substrate or flexible substrate to transcribe the adhesive resin layer onto the base roller; forming a mold surface layer on the adhesive resin layer; and curing the adhesive resin layer and the mold surface layer formed on the base roller to adhere the adhesive resin layer and the mold surface layer to fix the same on the base roller.

The step of providing the rigid substrate or flexible substrate provided with the master pattern may include forming a master pattern including a protrusion pattern and a groove pattern to provide the master pattern on the rigid substrate or flexible substrate having a flat surface, wherein the master pattern layer is made of an organic material which can be stripped, wherein the mold surface layer is made of diamond like carbon (DLC), silicon oxide ($SiO_2$) or indium tin oxide (ITO), and wherein the adhesive resin layer is a thermocurable or photocurable adhesive.

In accordance with another aspect of the present invention, provided is a roll mold including: a base roller; an adhesive resin layer formed on the base roller; and a mold surface layer formed between and on the adhesive resin layer.

In accordance with another aspect of the present invention, provided is a method for fabricating a thin film pattern, including: providing a roll mold including a base roller, an adhesive resin layer formed on the base roller, and a mold surface layer formed on the adhesive resin layer and the adhesive resin layer; forming a printing liquid on the roll mold or substrate; and rolling the roll mold on the substrate to form a thin film pattern on the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Hereinafter, the present invention will be described with reference to the annexed drawings.

Figure 1A:
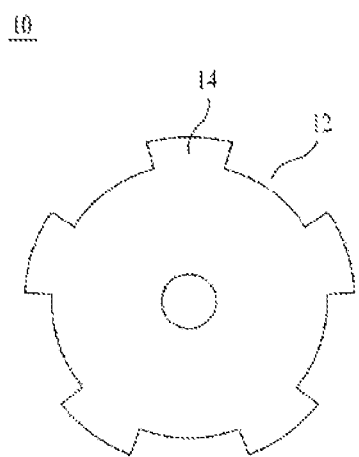
FIGS. 1A and 1B are sectional views illustrating a conventional roll mold.
Figure 1B:
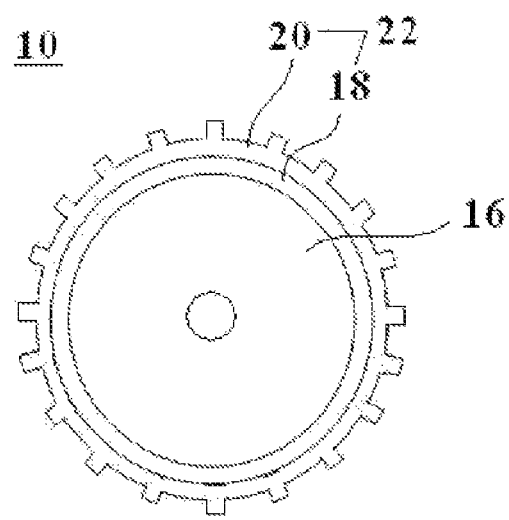
Figure 2:
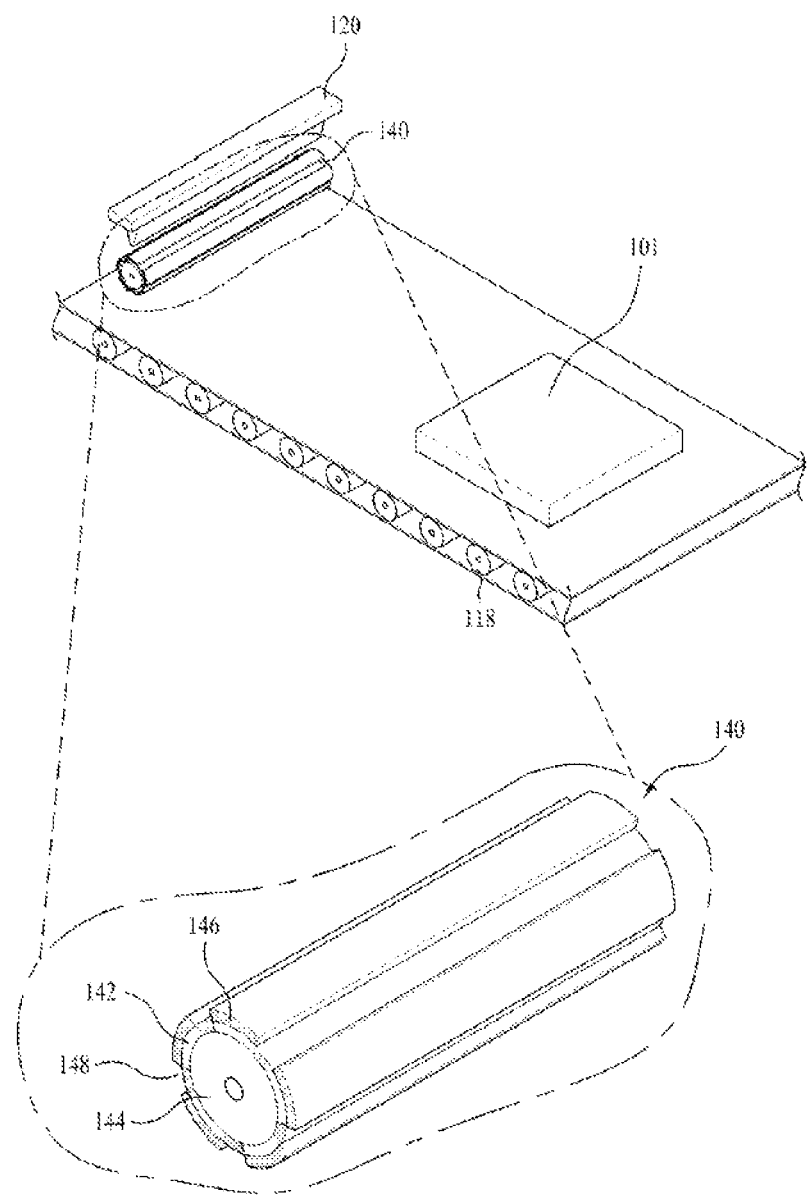
FIG. 2 is a perspective view illustrating a printing or imprinting device for forming a thin film pattern according to the present invention.

FIG. 2 is a perspective view illustrating a printing or imprinting device for forming a thin film pattern according to the present invention.

The printing or imprinting device in FIG. 2 includes a printing liquid supplier 120 and a roll mold 140.

The printing liquid supplier 120 stores a printing liquid. The stored printing liquid is supplied to a roll mold 140 using a printing method, or supplied to a substrate 101 using an imprinting method in the process of patterning the thin film.

The roll mold 140 rotates over a substrate 101 such that it contacts the substrate 101 conveyed by a conveyor 118. Alternatively, the roll mold 140 is moved and comes into contact with the substrate 101, while the substrate 101 is fixed.

A printing liquid from the printing liquid supplier 120 fills a groove 148 of the roll mold 140 by a printing method during the thin-film patterning process. The printing liquid in the groove 148 of the roll mold 140 is transcribed onto the substrate 101, while the roll mold 140 is rolled over the substrate 101.

In addition, the roll mold 140 is rolled over the substrate 101, to which the printing liquid is applied, using an imprinting method during the thin-film patterning, such that it comes into contact therewith.

Such a roll mold 140 includes a base roller 144, an adhesive resin layer 142 and a mold surface layer 146.

The adhesive resin layer 142 adheres the base roller 144 to the mold surface layer 146. In addition, the adhesive resin layer 142 offsets stress applied from the roll mold 140 to the substrate 101, when the roll mold 140 is rolled over the substrate 101, and offsets stress applied from the base roller 144 to the rigid substrate or flexible substrate, when the base roller 144 is rolled over the rigid substrate or flexible substrate in the process of forming the roll mold 140 described below. The adhesive resin layer 142 is made of a UV-curable or thermocurable adhesive such as a sealant provided between the base roller 144 and the mold surface layer 146.

The mold surface layer 146 is made of a hydrophobic material such as diamond like carbon (DLC), silicon oxide ($SiO_2$) or indium tin oxide (ITO) which exhibits high durability, superior mechanical properties and a release (detachment) property. The mold surface layer 146 is formed on the adhesive resin layer 142 and the base roller 144 such that it has a groove 148 having the same shape as the pattern to be formed on the substrate 101, or the inverse thereof.

Figure 3A:
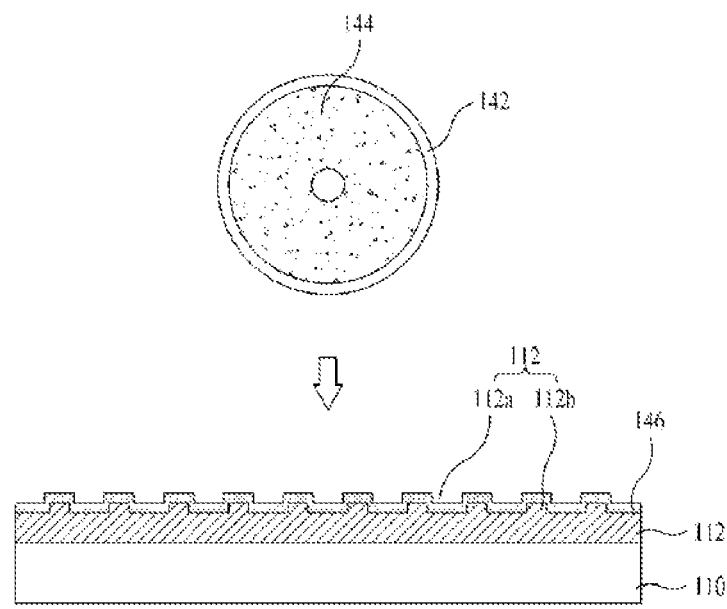
FIGS. 3A to 3C are sectional views illustrating a method for fabricating the roll mold illustrated in FIG. 2 according to a first embodiment.
Figure 3B:
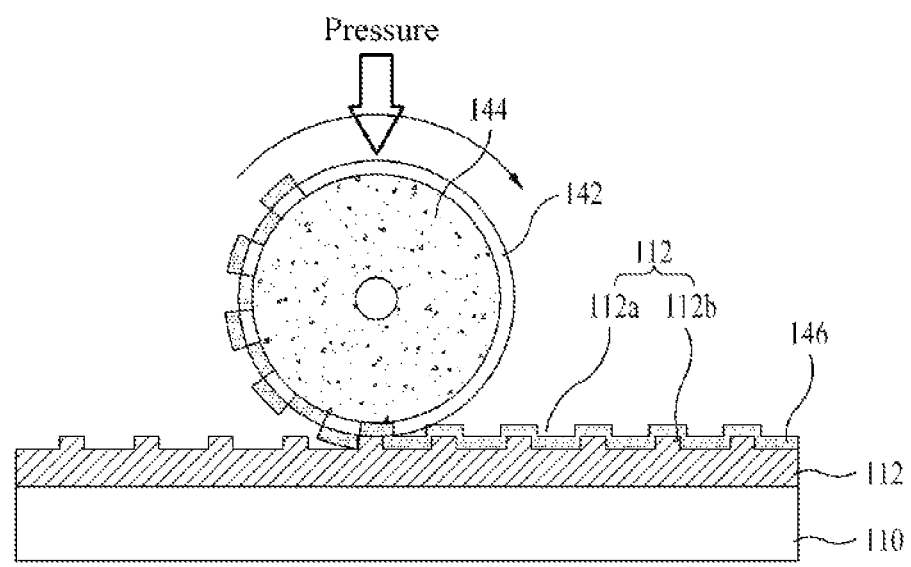
Figure 3C:
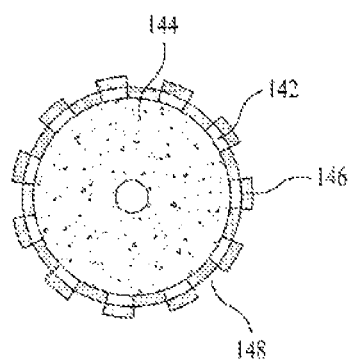

FIGS. 3A to 3C are sectional views illustrating a method for fabricating the roll mold illustrated in FIG. 2 according to a first embodiment.

As shown in FIG. 3A, a master pattern layer 112 having a groove pattern 112a and a protrusion pattern 112b is formed on a flat rigid substrate 110.

The master pattern layer 112 is formed by applying an organic material, which can be stripped, such as photoresist and patterning the material through photolithography, holographic lithography, laser processing, electron beam processing, focused ion beam processing or the like. Meanwhile, the master pattern layer 112 and the rigid substrate 110 are separately formed, or a master pattern having a groove pattern and a protrusion pattern on the rigid substrate 110 by patterning the rigid substrate 110 may be formed.

Then, the mold surface layer 146 is formed on the master pattern layer 112 along the protrusion pattern 112b and the groove pattern 112a of the mask pattern layer 112. The mold surface layer 146 is made of a hydrophobic material such as diamond like carbon (DLC), silicon oxide ($SiO_2$) or indium tin oxide (ITO) which exhibits high durability, superior mechanical properties and a release (detachment) property.

A base roller 144 to which the adhesive resin layer 142 is applied is provided on the mold surface layer 146. Meanwhile, the adhesive resin layer 142 may be formed on the mold surface layer 146, instead of on the base roller 144. The adhesive resin layer 142 is made of a UV-curable or thermocurable adhesive such as a sealant.

As shown in FIG. 3B, a base roller 144 provided with the adhesive resin layer 142 is rolled over the rigid substrate 110 provided with the mold surface layer 146. Based on the pressure applied when the base roller 144 is rolled over the rigid substrate 110, the mold surface layer 146 corresponding to the protrusion pattern 112b of the master pattern layer 112 is formed on the base roller 144 such that it comes into contact with the base roller 144, and the mold surface layer 146 corresponding to the groove pattern 112a of the master pattern layer 112 is formed on the adhesive resin layer 142. Accordingly, based on the pressure formed by rotation of the base roller 144, the mold surface layer 146 corresponding to the protrusion pattern 112b of the master pattern layer 112 is formed on the base roller 144 such that it comes in contact with the base roller 144, and the mold surface layer 146 corresponding to the groove pattern 112a of the master pattern layer 112 is formed on the adhesive resin layer 142.

Then, the adhesive resin layer 142 is cured by UV irradiation or heating. As a result, the mold surface layer 146 and the adhesive resin layer 142 provided on the base roller 144 are cured and thus adhered to and fixed on the base roller 144.

Accordingly, as shown in FIG. 3C, the mold surface layer 146 is formed between and on the adhesive resin layers 142, to complete a roll mold 140 having a groove 148 corresponding to a region between the adhesive resin layers 142.

Figure 4A:
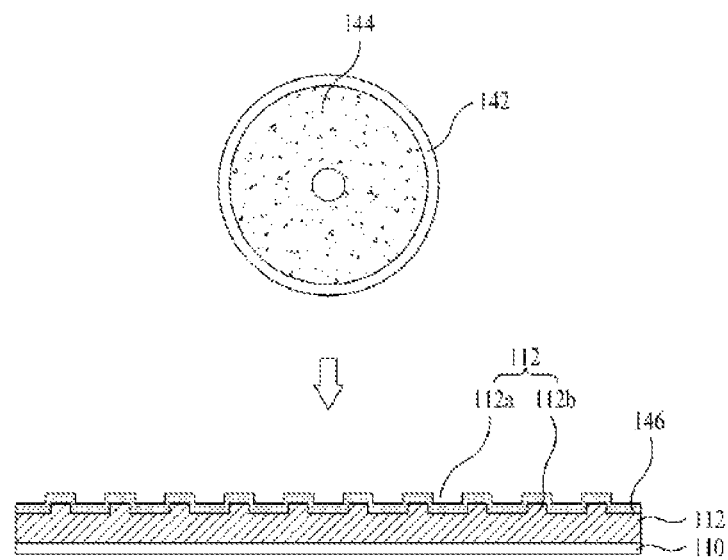
FIGS. 4A to 4C are sectional views illustrating a method for fabricating the roll mold illustrated in FIG. 2 according to a second embodiment.
Figure 4B:
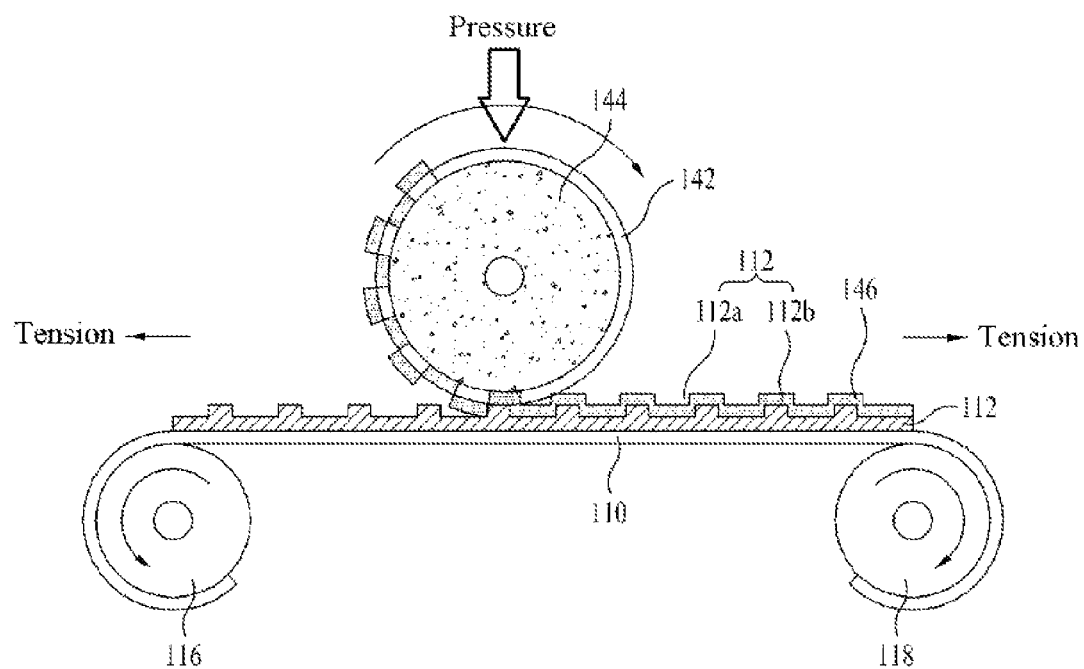
Figure 4C:
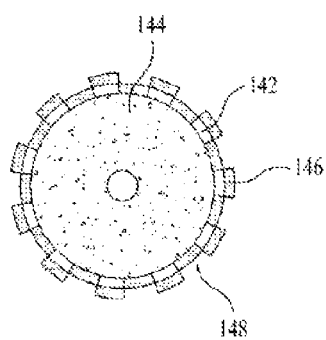

FIGS. 4A to 4C are sectional views illustrating a method for fabricating the roll mold illustrated in FIG. 2 according to a second embodiment.

As shown in FIG. 4A, a master pattern layer 112 having a groove pattern 112a and a protrusion pattern 112b is formed on a flat rigid substrate 110. The master pattern layer 112 is formed by applying an organic material, which can be stripped, such as photoresist, and patterning the material using a process such as photolithography, holographic lithography, laser processing, electron beam processing, focused ion beam processing or the like. Then, the mold surface layer 146 is formed on the master pattern layer 112 along the protrusion pattern 112b and the groove pattern 112a of the mask pattern layer 112. The mold surface layer 146 is made of a hydrophobic material such as diamond like carbon (DLC), silicon oxide ($SiO_2$) or indium tin oxide (ITO) which exhibits high durability, superior mechanical properties and a release (detachment) property.

A base roller 144, to which the adhesive resin layer 142 is applied, is provided on the mold surface layer 146. Meanwhile, the adhesive resin layer 142 may be formed on the mold surface layer 146, instead of on the base roller 144. The adhesive resin layer 142 is made of a UV-curable or thermocurable adhesive such as a sealant.

As shown in FIG. 4B, both ends of the flexible substrate 110 provided with the mold surface layer 146 are rolled on a re-winder 118 and an un-winder 116, thereby keeping the flexible substrate 110 level. That is, one end of the flexible substrate 110 is adhered to the un-winder 116 and the other end of the flexible substrate 110 is adhered to the re-winder 118. At this time, the master pattern layer 112 and the mold surface layer 146 may be formed or not formed on both ends of the flexible substrate 110 rolled on the re-winder 118 and un-winder 116.

Next, the base roller 144 provided with the adhesive resin layer 142 is rolled over the flexible substrate 110 provided with the mold surface layer 146. Accordingly, the mold surface layer 146 is transcribed on and adhered to the adhesive resin layer 142. At this time, based on the pressure applied when the base roller 144 is rolled over the mold surface layer 146, the mold surface layer 146 corresponding to the protrusion pattern 112b of the master pattern layer 112 is formed on the base roller 144 such that it comes into contact with the base roller 144, and the mold surface layer 146 corresponding to the groove pattern 112a of the master pattern layer 112 is formed on the adhesive resin layer 142.

Then, the adhesive resin layer 142 is cured by UV irradiation or heating. As a result, the mold surface layer 146 and the adhesive resin layer 142 provided on the base roller 144 are cured and thus adhered to and fixed on the base roller 144.

Accordingly, as shown in FIG. 4C, the mold surface layer 146 is formed between and on the adhesive resin layers 142, to complete a roll mold 140 having a groove 148 corresponding to a region between the adhesive resin layers 142.

Figure 5A:
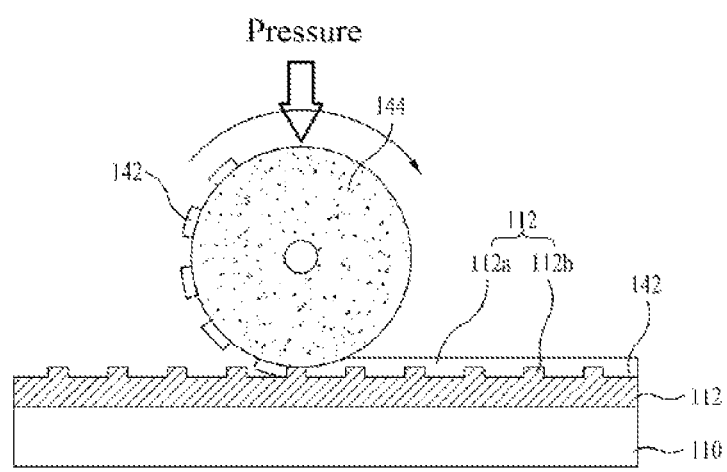
FIGS. 5A to 5C are sectional views illustrating a method for fabricating the roll mold illustrated in FIG. 2 according to a third embodiment.
Figure 5B:
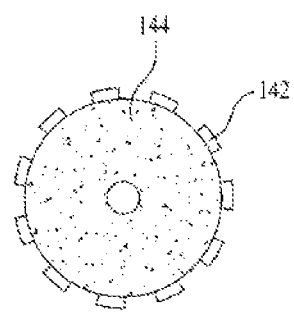
Figure 5C:
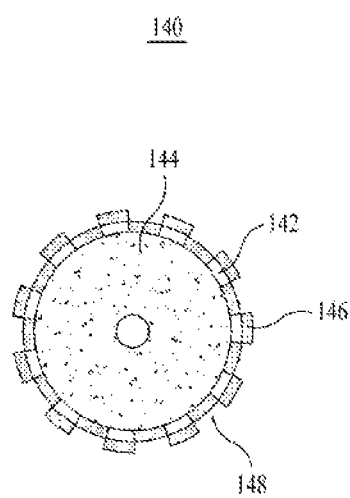

FIGS. 5A to 5C are sectional views illustrating a method for fabricating the roll mold illustrated in FIG. 2 according to a third embodiment.

As shown in FIG. 5A, a master pattern layer 112 having a groove pattern 112a and a protrusion pattern 112b is formed on a rigid or flexible substrate 110. The master pattern layer 112 is formed by applying an organic material, which can be stripped, such as a photoresist, and patterning the material using a process such as photolithography, holographic lithography, laser processing, electron beam processing, focused ion beam processing or the like. Then, an adhesive resin layer 142 is formed on the master pattern layer 112. The adhesive resin layer 142 is made of a UV-curable or thermocurable adhesive such as a sealant.

Then, the base roller 144 is rolled over the flexible substrate 110 provided with the adhesive resin layer 142. Accordingly, the adhesive resin layer 142 is transcribed to the base roller 144 and is thus formed on the base roller 144, as shown in FIG. 5B.

A mold surface layer 146 is formed on the base roller 144 provided with the adhesive resin layer 142 by sputtering or PECVD, as shown in FIG. 5C. The mold surface layer 146 is made of a hydrophobic material such as diamond like carbon (DLC), silicon oxide ($SiO_2$) or indium tin oxide (ITO) which exhibits high durability, superior mechanical properties and a release (detachment) property. The mold surface layer 146 is formed between and on the adhesive resin layers 142, to complete a roll mold 140 in which a groove 148 is provided in a region provided between the adjacent two adhesive resin layers 142.

Figure 6:
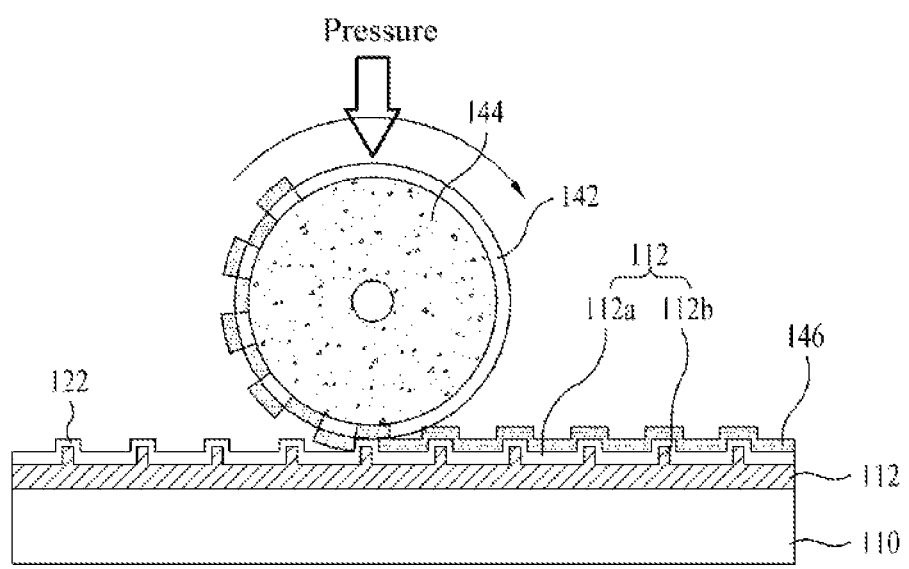
FIG. 6 is a sectional view illustrating an anti-adhesion layer formed between the master pattern layer and the mold surface layer shown in FIGS. 3B, 4B and 5A.

Meanwhile, the master pattern layer 112 is subjected to anti-adhesion treatment, as shown in FIGS. 3B, 4B and 5A, or an anti-adhesion layer 122 may be formed between the mold surface layer 146 (or adhesive resin layer 142) and the master pattern layer 112, as shown in FIG. 6.

The anti-adhesion layer 122 prevents adhesion of the master pattern layer 112 to the roll mold 140 along the mold surface layer 146 or adhesive resin layer 142, when the master pattern layer 112 and the mold surface layer 146 (in FIGS. 3B and 4A, or adhesive resin layer 142 in FIG. 5A) are released or detached. The anti-adhesion layer 122 is made of FOTS (fluoro-octyl-trichloro-silane) or HDFS ((heptadecafluoro-1,1,2,3-tetrahydrodecyl)trichlorosilane).

In addition to the anti-adhesion treatment or formation of anti-adhesion layer, the master pattern layer 112 may be formed of a hydrophobic material and the base roller 144 may be formed of a hydrophilic material, to improve release of the roll mold 140.

In addition, when the master pattern layer 112 is adhered to the roll mold 140 along the mold surface layer 146 or adhesive resin layer 142, the master pattern layer 112 is removed from the roll mold 140 by a stripping process.

Figure 7A:
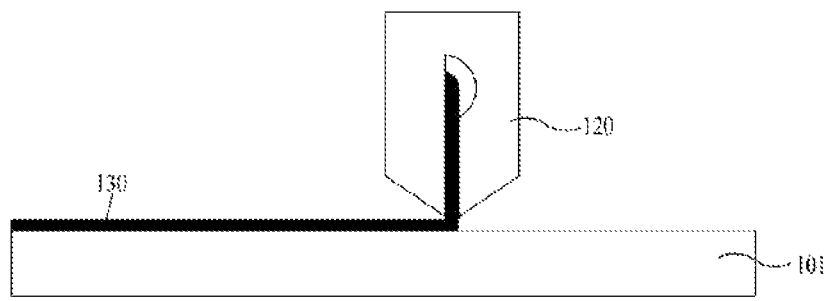
FIGS. 7A to 7C are views illustrating a method for fabricating a thin film pattern via an imprinting method employing a roll mold according to a first embodiment.
Figure 7B:
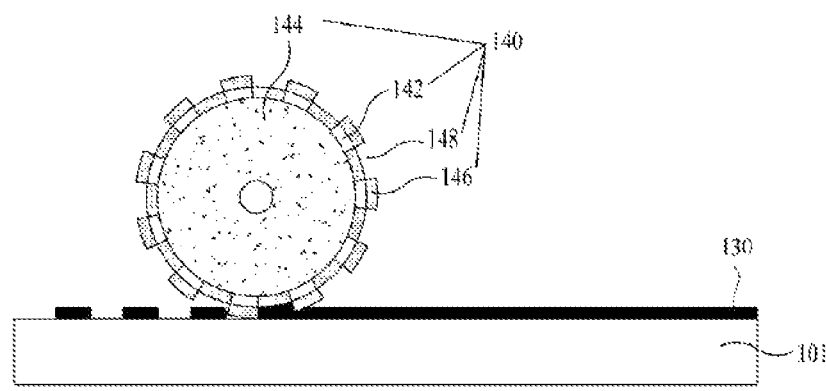
Figure 7C:

As shown in FIGS. 7A to 7C are views illustrating a method for patterning a thin film via an imprinting method employing a roll mold according to a first embodiment.

In FIG. 7A, a printing liquid 130 is applied to a substrate 101 through a printing liquid supplier 120. Then, as shown in FIG. 7B, a roll mold 140 including a base roller 144, an adhesive resin layer 142 and a master pattern layer 146 is aligned. The roll mold 140 is rolled over the substrate 101. At this time, a printing liquid 130 is cured through a curing apparatus, such as a UV lamp, provided in the base roller 144 of the roll mold 140, or a curing apparatus provided on the rear surface of the substrate 101. As a result, as shown in FIG. 7C, the printing liquid 130 is formed in the form of a thin film pattern on the substrate 101.

Figure 8A:
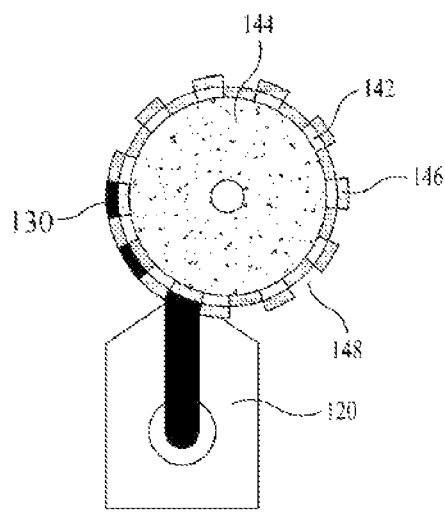
FIGS. 8A to 8C are views illustrating a method for fabricating a thin film pattern via a printing method employing a roll mold according to a second embodiment.
Figure 8B:
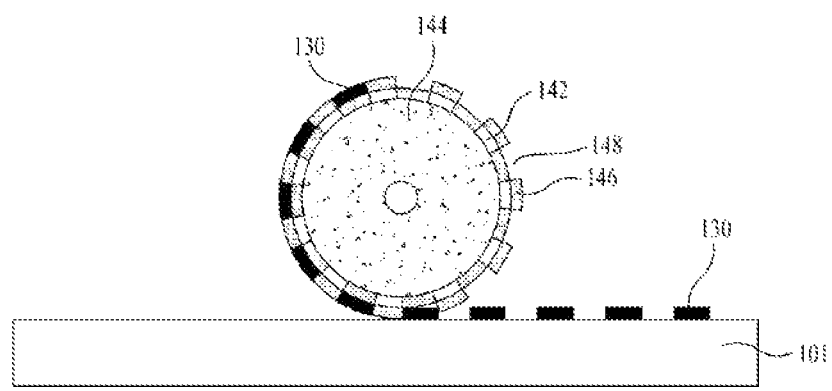
Figure 8C:

FIGS. 8A to 8C are views illustrating a method for patterning a thin film via a printing method employing a roll mold according to a second embodiment.

As shown in FIG. 8A, a roll mold 140 including a base roller 144, an adhesive resin layer 142 and a master pattern layer 146 is provided. The printing liquid 130 is filled through the printing liquid supplier 120 in the groove 148 of the roll mold 140.

Then, as shown in FIG. 8B, the roll mold 140, filled with the printing liquid 130, is rolled over the substrate 101. Accordingly, the printing liquid 130 is transcribed, dried and cured on the substrate 101 and is thus formed into a thin film pattern, as shown in FIG. 8C.

FIGS. 9A to 9D are views illustrating a method for patterning a thin film via a printing method employing a roll mold according to a third embodiment.

Figure 9A:
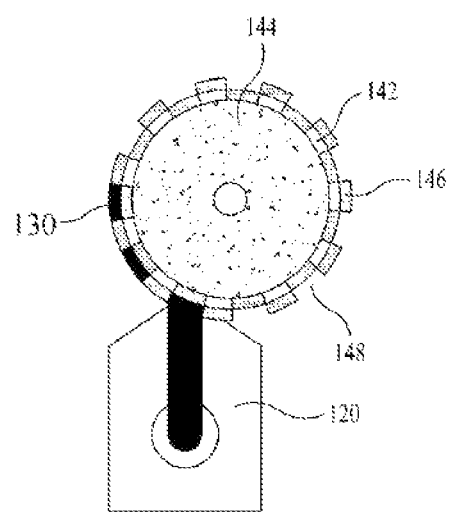
FIGS. 9A to 9D are views illustrating a method for fabricating a thin film pattern via a printing method employing a roll mold according to a third embodiment.

As shown in FIG. 9A, a roll mold 140 including a base roller 144, an adhesive resin layer 142 and a master pattern layer 146 is provided. A printing liquid 130, supplied through the printing liquid supplier 120, fills the groove 148 of the roll mold 140.

Figure 9B:
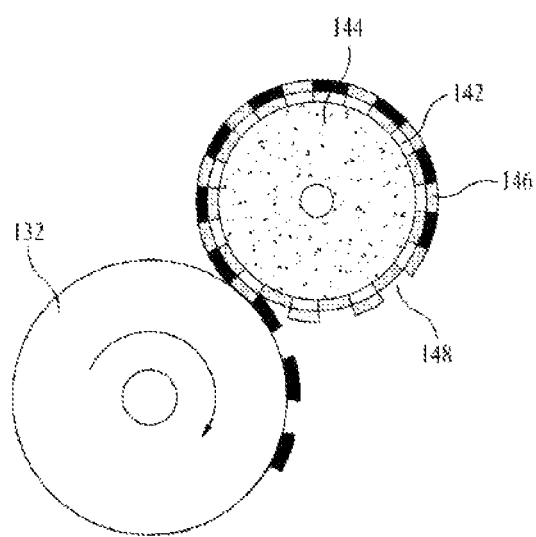
Figure 9C:
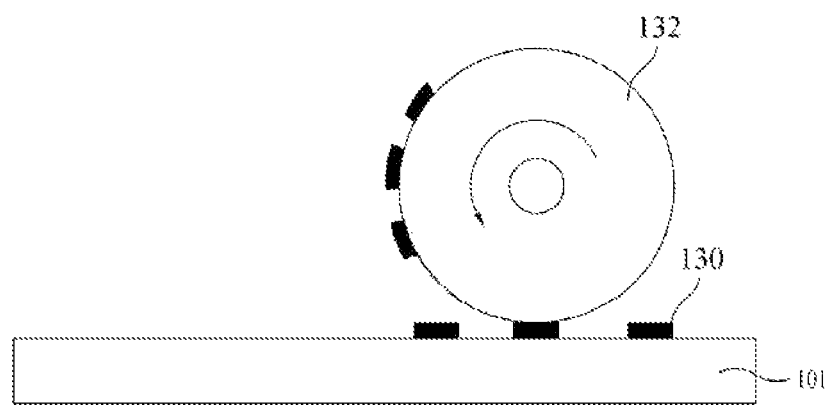
Figure 9D:

Then, as shown in FIG. 9B, the printing liquid 130 is transcribed to a transcription roller 132, which rotates, and, at the same time, is engaged in the roll mold 140. The roll mold 140 provided with the printing liquid 130 is rolled over the substrate 101. Accordingly, the printing liquid 130 is transcribed, dried and cured on the substrate 101 and is thus formed into a thin film pattern, as shown in FIG. 9D.

Figure 10:
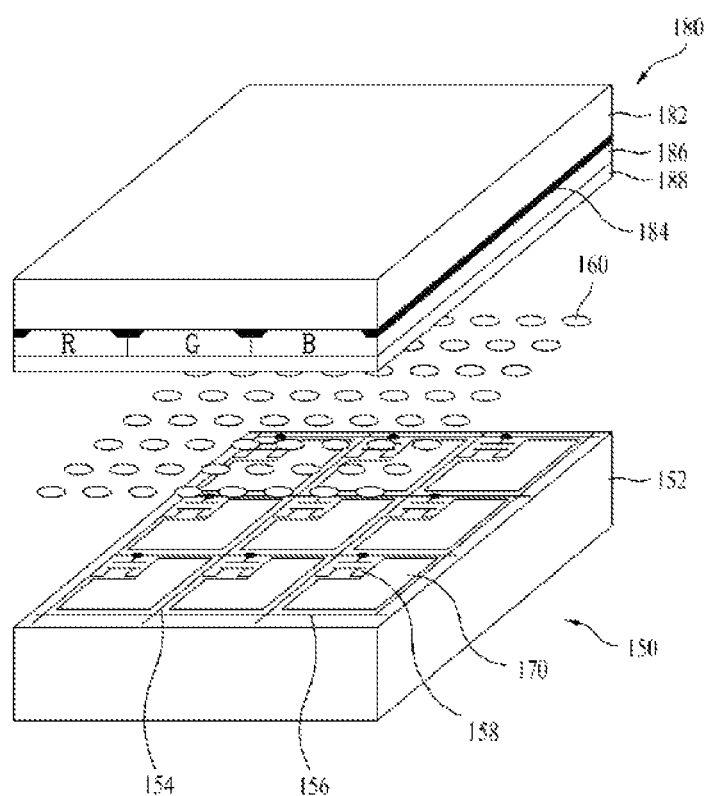
FIG. 10 is a perspective view illustrating a liquid crystal display panel formed via the method of fabricating a thin film pattern according to the present invention.

Specifically, a liquid crystal display panel according to the present invention, as shown in FIG. 10, includes a thin film transistor substrate 150 and a color filter substrate 180 such that the liquid crystal layer 160 is interposed between the thin film transistor substrate 150 and the color filter substrate 180.

The color filter substrate 180 includes a black matrix 184, a color filter 186, a common electrode 188, and a column spacer (not shown) arranged on an upper substrate 182 in this order.

The thin film transistor substrate 150 includes a plurality of gate lines 156 and a plurality of data lines 154 which cross each other on a lower substrate 152, a thin film transistor 158 adjacent to each intersection between the gate lines 156 and the data lines 154, and a pixel electrode 170 formed at a pixel region provided by the intersection.

An organic pattern used as a mask for patterning a thin film pattern made of an organic material such as the color filter 186, the black matrix 184 and the column spacer of the liquid crystal display panel and for patterning a thin film pattern made of an inorganic material such as the thin film transistor 188, gate lines 186, data lines 184 and pixel electrode 170 of the liquid crystal display panel may be formed by a printing process using the roll mold according to the present invention.

In addition, the roll mold according to the present invention may be used to form thin or thick films on flat panel display devices such as plasma display panels, electroluminescent (EL) display panels and field emission display devices as well as liquid crystal display panels.

The present invention forms a roll mold using application and transcription processes without using any conventional etching process, thus reducing fabrication process complexity and costs and preventing dimensional variation of a roll mold caused by the etching process. In addition, the roll mold, a method for fabricating the same, and a method for fabricating a thin film pattern using the same according to the present invention can secure mechanical properties, durability and release of a roll mold, since a mold surface layer (the uppermost layer of the roll mold) is made of a hard and hydrophobic material. In addition, the present invention can obtain offset effects upon roll imprinting, since a soft adhesive resin layer is formed between a mold surface layer made of a hard material and a base roller made of a hard material. In addition, the present invention can offset deformation of substrate caused by tension, pressure and heat in a roll-to-roll imprinting process when the base roller is rolled over a rigid substrate or flexible substrate. Accordingly, the present invention can maintain the size of master pattern layer even after fabrication of the roll mold.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for fabricating a roll mold comprising:
   providing a rigid substrate or flexible substrate provided with a master pattern;
   providing a base roller on the substrate provided with the master pattern;
   forming a mold surface layer on the substrate provided with the master pattern;
   forming an adhesive resin layer on the mold surface layer or the base roller;
   rolling the base roller on the rigid substrate or flexible substrate to form the adhesive resin layer and the mold surface layer on the base roller; and
   curing the adhesive resin layer and the mold surface layer formed on the base roller to adhere the adhesive resin layer and the mold surface layer to the base roller and to fix the same thereon.

2. The method according to claim 1, wherein the step of providing the rigid substrate or flexible substrate provided with the master pattern comprises forming a master pattern including a protrusion pattern and a groove pattern to provide the master pattern on the rigid substrate or flexible substrate having a flat surface,
   wherein the master pattern layer is made of an organic material which can be stripped,
   wherein the mold surface layer is made of diamond like carbon (DLC), silicon oxide ($SiO_2$) or indium tin oxide (ITO),
   wherein the adhesive resin layer is a thermocurable or photocurable adhesive.

3. The method according to claim 2, further comprising:
   forming an anti-adhesion layer between the mold surface layer and the master pattern layer.

4. The method according to claim 2, further comprising:
   removing the master pattern layer remaining on the mold surface layer by a stripping process, after adhering the adhesive resin layer and the mold surface layer to the base roller and fixing the same thereon.

5. The method according to claim 1, wherein the step of rolling the base roller over the rigid substrate or flexible substrate is carried out by rolling the base roller over the flexible substrate, while one end of the flexible substrate is adhered to an un-winder and the other end of the flexible substrate is adhered to a re-winder and keeping the flexible substrate level.

6. A method for fabricating a roll mold comprising:
   providing a rigid substrate or flexible substrate provided with a master pattern;

providing a base roller on the substrate provided with the master pattern;

forming an adhesive resin layer on the substrate provided with the master pattern;

rolling the base roller over the rigid substrate or flexible substrate to transcribe the adhesive resin layer to the base roller;

forming a mold surface layer on the adhesive resin layer; and curing the adhesive resin layer and mold surface layer formed on the base roller to adhere the adhesive resin layer and the mold surface layer to the base roller and to fix the same on the base roller.

7. The method according to claim 6, wherein the step of providing the rigid substrate or flexible substrate provided with the master pattern comprises forming a master pattern layer including a protrusion pattern and a groove pattern to provide the master pattern on the rigid substrate or flexible substrate having a flat surface, wherein the master pattern layer is made of an organic material which can be stripped, wherein the mold surface layer is made of diamond like carbon (DLC), silicon oxide ($SiO_2$) or indium tin oxide (ITO), wherein the adhesive resin layer is a thermocurable or photocurable adhesive.

* * * * *